United States Patent
Hwang et al.

(10) Patent No.: US 7,344,973 B2
(45) Date of Patent: Mar. 18, 2008

(54) SEMICONDUCTOR DEVICE AND METHOD OF MANUFACTURING THE SAME

(75) Inventors: Kyung Ho Hwang, Yongin-si (KR); Won Mo Lee, Seoul (KR)

(73) Assignee: Hynix Semiconductor Inc., Gyunggi-do (KR)

( * ) Notice: Subject to any disclaimer, the term of this patent is extended or adjusted under 35 U.S.C. 154(b) by 176 days.

(21) Appl. No.: 11/265,683

(22) Filed: Nov. 2, 2005

(65) Prior Publication Data

US 2006/0170005 A1   Aug. 3, 2006

(30) Foreign Application Priority Data

Feb. 2, 2005   (KR) .................. 10-2005-0009652

(51) Int. Cl.
*H01L 21/4763* (2006.01)
(52) U.S. Cl. .................. 438/629; 438/641; 438/675
(58) Field of Classification Search .......... 438/629, 438/641, 674, 675
See application file for complete search history.

(56) References Cited

U.S. PATENT DOCUMENTS

| | | | | |
|---|---|---|---|---|
| 6,008,085 A | * | 12/1999 | Sung et al. .................. | 438/253 |
| 6,159,839 A | * | 12/2000 | Jeng et al. .................. | 438/618 |
| 2004/0102039 A1 | | 5/2004 | Lim et al. .................. | 438/674 |
| 2005/0245073 A1 | * | 11/2005 | Lee et al. .................. | 438/629 |

FOREIGN PATENT DOCUMENTS

| KR | 20010064122 | 7/2001 |
|---|---|---|
| KR | 1020030056340 A | 7/2003 |
| KR | 10-2004-0025967 | 3/2004 |
| KR | 20050000059 | 1/2005 |

* cited by examiner

*Primary Examiner*—Fernando L. Toledo
(74) *Attorney, Agent, or Firm*—Marshall, Gerstein & Borun LLP

(57) ABSTRACT

Provided are a semiconductor device, adapted to be capable of fabricating the device having improved resistance characteristic by decreasing dishing of solid phase epitaxy (SPE) silicon during planarization in a landing plug forming process via use of SPE silicon, and a method of manufacturing the same.

The method of manufacturing a semiconductor device in accordance with the present invention comprises, forming a plurality of gates on a semiconductor substrate; forming an interlayer dielectric film thereon, such that the gates are embedded; selectively etching the interlayer dielectric film to open a landing plug-forming region; depositing SPE silicon, such that the opened landing plug-forming region in the interlayer dielectric film is embedded; implanting boron ions into the SPE silicon; and annealing the resulting boron ion-implanted structure.

5 Claims, 5 Drawing Sheets

SEMICONDUCTOR DEVICE AND METHOD OF MANUFACTURING THE SAME

BACKGROUND OF THE INVENTION

1. Field of the Invention

The present invention relates to a semiconductor device, which enables fabrication of the device having improved resistance characteristics by decreasing dishing of solid phase epitaxy (SPE) silicon during planarization in a landing plug forming process utilizing SPE silicon, and a method of manufacturing the same.

2. Description of the Related Art

Generally, landing plugs are polysilicon layers formed between word lines, have respective independent characteristic regions, and are connected with bit line contacts and storage node contacts connected with capacitors.

In order to form such a landing plug, a plurality of gates is formed on a semiconductor substrate, and an interlayer dielectric film is deposited thereon, such that a plurality of gates is embedded. Then, the interlayer dielectric film is selectively etched to open a landing plug-forming region, and polysilicon for a landing plug is deposited such that the thus-opened landing plug-forming region in the interlayer dielectric film is embedded.

Next, polysilicon for a landing plug is planarized to a point at which the upper parts of the gates are exposed, and thus is isolated between the gates, thereby forming a landing plug, made of polysilicon for a landing plug, between gates. Herein, planarization is carried out via use of a chemical mechanical polishing process.

In this connection, at present, in forming the landing plug in a 0.08 μm-sized semiconductor device, use of polysilicon for a landing plug, as a landing plug-forming material, leads to deterioration of interface resistance in cell regions (cell SNC N-/Rc), due to different crystal forms between the substrate and polysilicon for a landing plug, that is, because the substrate, composed of silicon (Si), is composed of single crystals, while the landing plug, composed of polysilicon (Poly Si) for a landing plug, is composed of polycrystals. As such, in order to improve interface resistance in cell regions, the landing plug has been formed utilizing solid phase epitaxy (SPE) silicon composed of single crystals like a substrate, instead of polysilicon for a landing plug.

However, formation of the landing plug via use of SPE silicon exhibits improvement in interface resistance of cell regions, but a higher degree of dishing during planarization, as compared to the use of polysilicon for a landing plug, thereby creating problems such as decreased critical dimension (CD) values of the landing plug and bit line contact.

Hereinafter, such problems will be described in more detail with reference to FIGS. 1 through 3.

FIG. 1 is a TEM showing results of comparison between formation of a landing plug using polysilicon for a landing plug and formation of a landing plug using SPE silicon. Upon referring to FIG. 1, in forming landing plug 20 between gates 10 by planarizing a landing plug-forming material, planarization via use of polysilicon for a landing plug as the landing plug-forming material exhibited dishing of 292 Å, while planarization via use of SPE silicon as the landing plug-forming material exhibited dishing of 364 Å, thus confirming that SPE silicon exhibits greater dishing than polysilicon for a landing plug.

In addition, FIG. 2 is AFM data comparing a degree of dishing between polysilicon for a landing plug and SPE silicon, after planarization for formation of a landing plug. The AFM data shows the results of dishing determined at 7 points, and it can be seen from such results that the degree of dishing occurred in formation of a landing plug using SPE silicon is greater than formation of a landing plug using polysilicon for a landing plug and 1-σ values are also greater in SPE silicon than polysilicon. As described above, when dishing during planarization for formation of a landing plug is increased, CD of a landing plug and bit line contact thereon after formation of a landing plug is decreased.

FIG. 3 is a graph showing the critical dimension (CD) of a bit line contact after etching for formation of a bit line contact on the landing plug, following formation of the landing plug, as described above, and shows results of comparison between use of polysilicon for a landing plug and SPE silicon as a landing plug-forming material. Upon reviewing the graph of FIG. 3, it can be seen that CD of a subsequent bit line contact becomes smaller, as dishing occurred in formation of a landing plug via use of SPE silicon is deeper than formation of a landing plug via use of polysilicon for a landing plug. Formation of such a small CD value leads to an increase in contact resistance.

SUMMARY OF THE INVENTION

Therefore, the present invention has been made in view of the above problems, and it is an object of the present invention to provide a semiconductor device, adapted to be capable of fabricating the device having improved resistance characteristic by decreasing dishing of solid phase epitaxy (SPE) silicon during planarization in a landing plug forming process, in particular, via use of SPE silicon, and a method of manufacturing the same.

In accordance with an aspect of the present invention, the above and other objects can be accomplished by the provision of a semiconductor device, comprising:

a plurality of gates formed on a semiconductor substrate;

landing plugs formed on predetermined regions between the gates, and composed of single crystal silicon, SPE silicon and boron ion-implanted SPE silicon sequentially stacked on the semiconductor substrate; and an interlayer dielectric film formed on the semiconductor substrate, such that the gates are embedded.

Preferably, boron ions are implanted at an implantation concentration of $10^{11}$ to $10^{15}$ ions/cm$^2$.

In accordance with another aspect of the present invention, there is provided a method of manufacturing a semiconductor device, comprising:

forming a plurality of gates on a semiconductor substrate;

forming an interlayer dielectric film thereon, such that the gates are embedded;

selectively etching the interlayer dielectric film to open landing plug-forming regions;

depositing SPE silicon, such that the opened landing plug-forming regions in the interlayer dielectric film is embedded;

implanting boron ions into the SPE silicon; and annealing the resulting boron ion-implanted structure.

Preferably, boron ions are implanted at an implantation concentration of $10^{11}$ to $10^{15}$ ions/cm$^2$.

In addition, annealing is preferably carried out at a temperature of 500 to 800° C., such that boron ions are diffused downward from the upper part of the SPE silicon, and single crystal silicon are grown upward from the lower part thereof adjoining the substrate.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
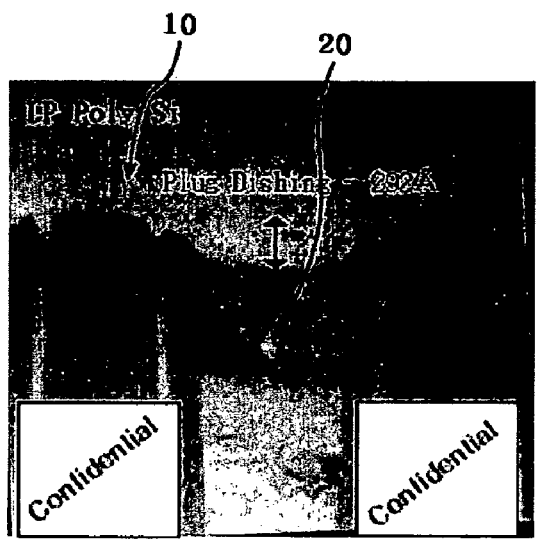
FIG. 1 is a TEM showing results of comparison between formation of a landing plug using polysilicon for a landing plug and formation of a landing plug using SPE silicon, in accordance with a conventional art.
Figure 1:
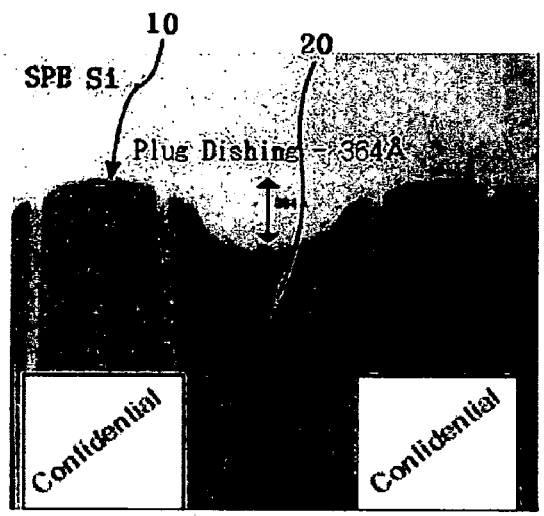
Figure 2:
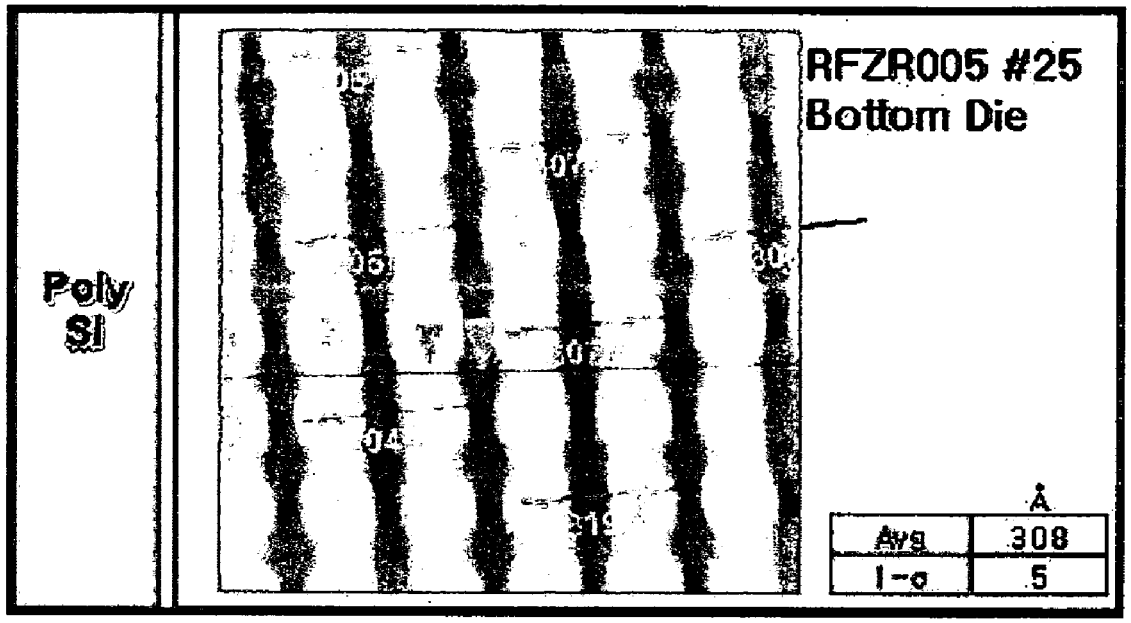
FIG. 2 is AFM data comparing a degree of dishing between polysilicon for a landing plug and SPE silicon, after planarization for formation of a landing plug in accordance with a conventional art.
Figure 2:
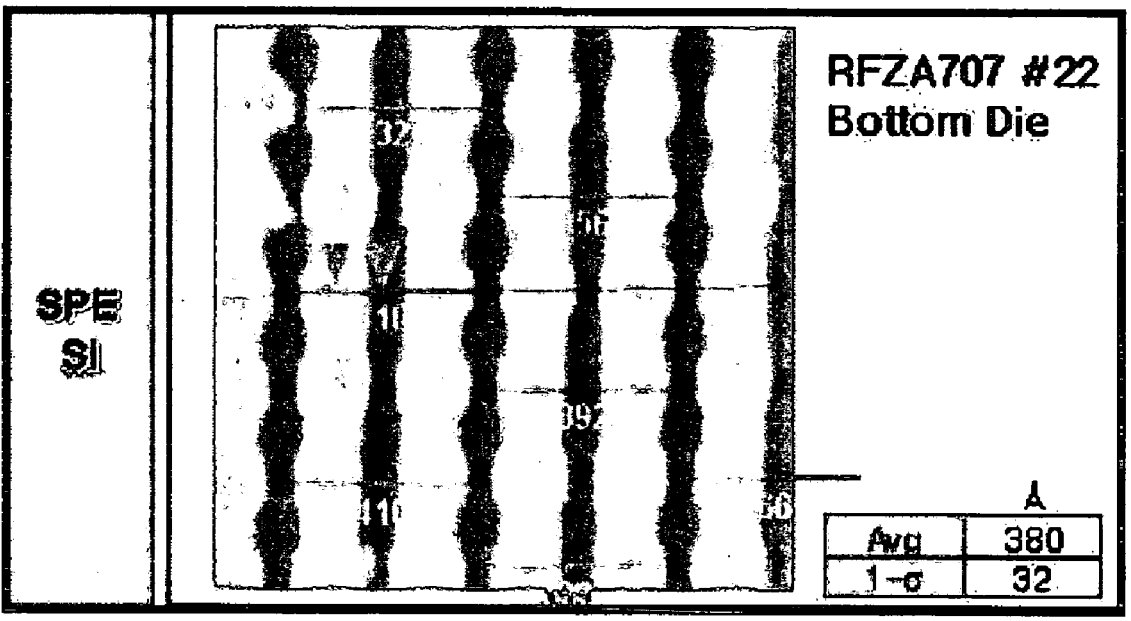
Figure 3:
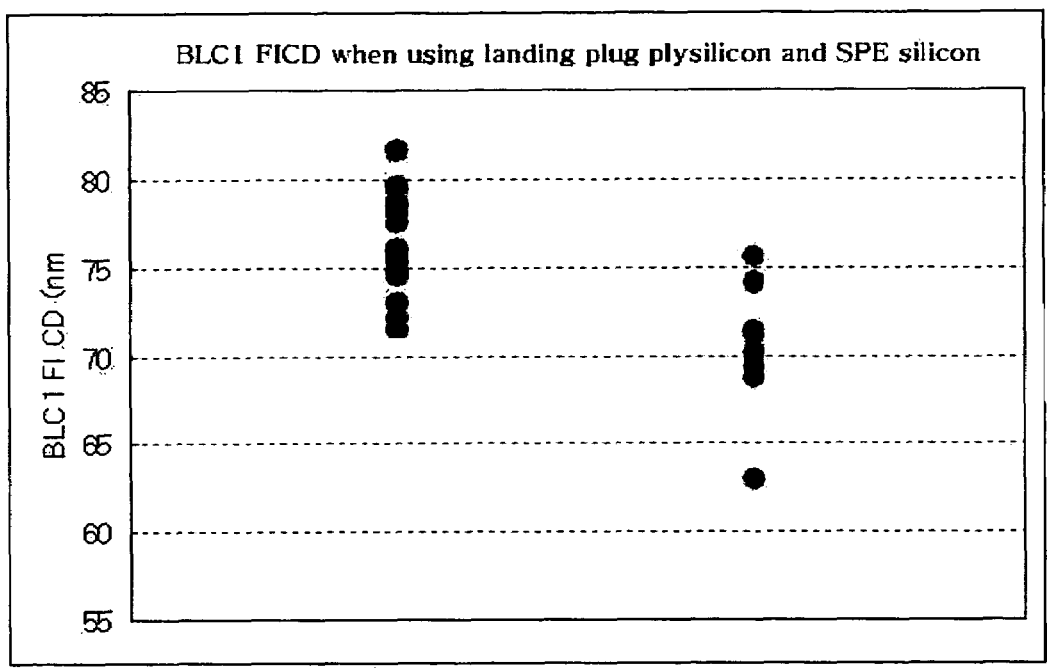
FIG. 3 is a graph showing critical dimension (CD) of a bit line contact after etching for formation of a bit line contact on a landing plug, when using polysilicon for a landing plug and SPE silicon as a landing plug-forming material in accordance with a conventional art.

Now, preferred embodiments of the present invention will be described in more detail with reference to accompanying drawings, such that those skilled in the art can easily practice the present invention.

In the drawings, thicknesses of various layers and regions are exaggerated for clarity. Like numbers refer to like elements throughout the specification and drawings.

Hereinafter, a method of manufacturing a semiconductor device in accordance with the embodiment of the present invention will be described with reference to FIGS. 4a through 4e.

Figure 4A:
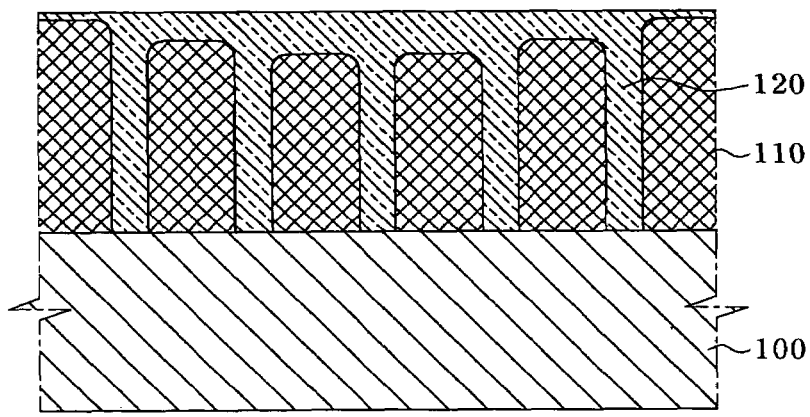
FIGS. 4a and 4e are sequential process cross-sectional views illustrating a method of manufacturing a semiconductor device in accordance with an embodiment of the present invention.
Figure 4B:
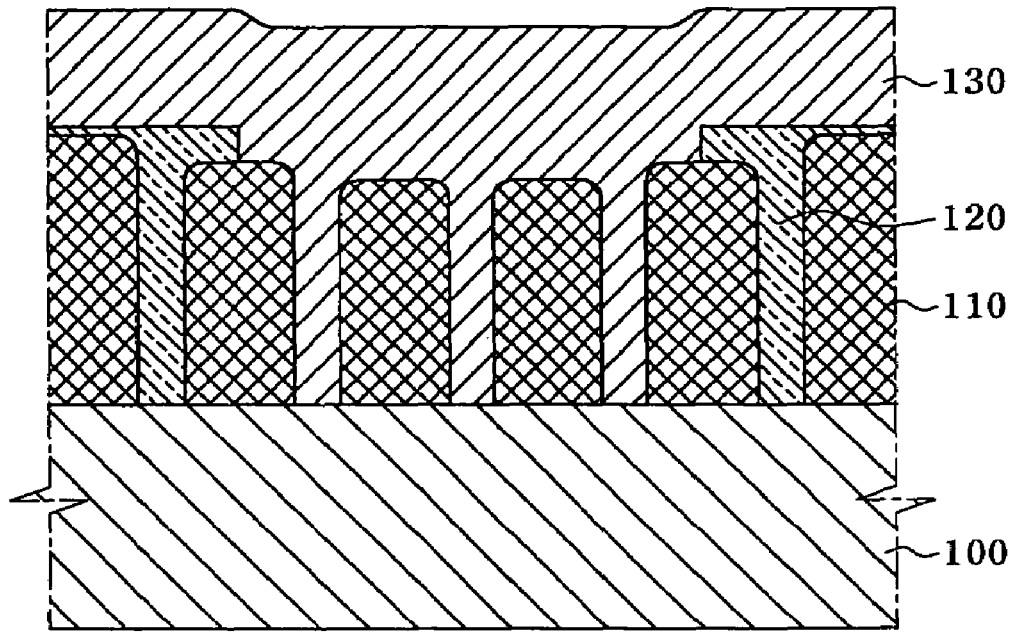
Figure 4C:
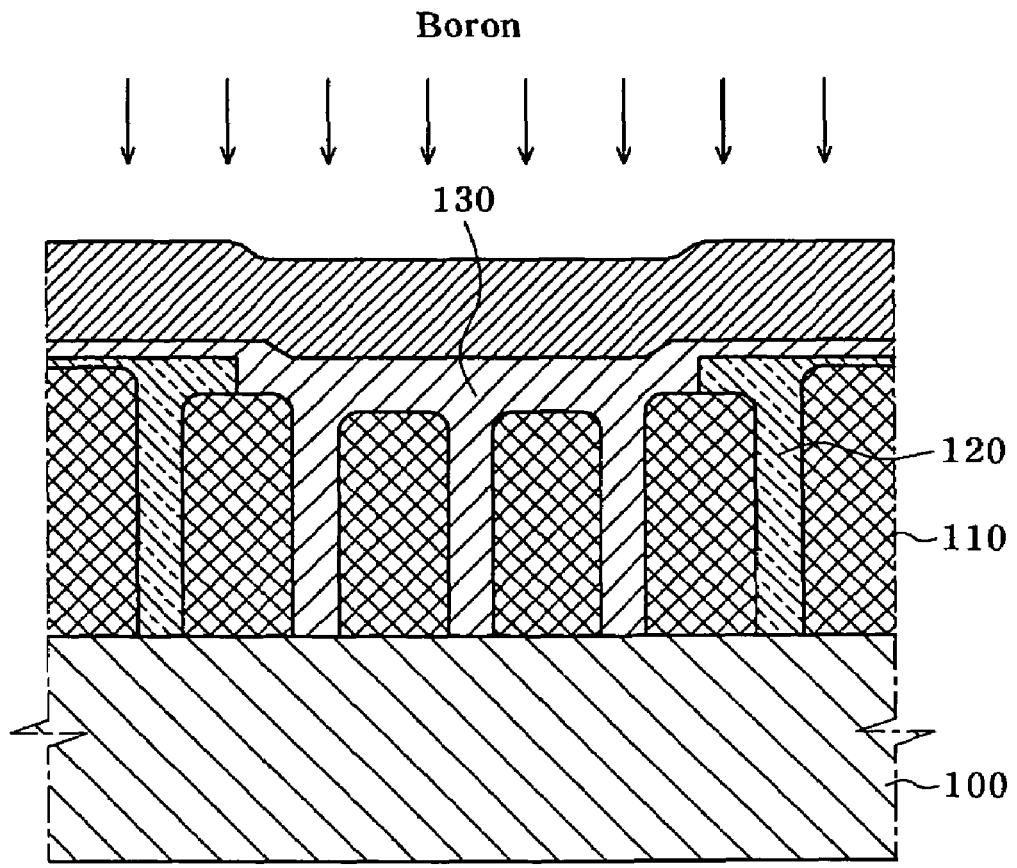
Figure 4D:
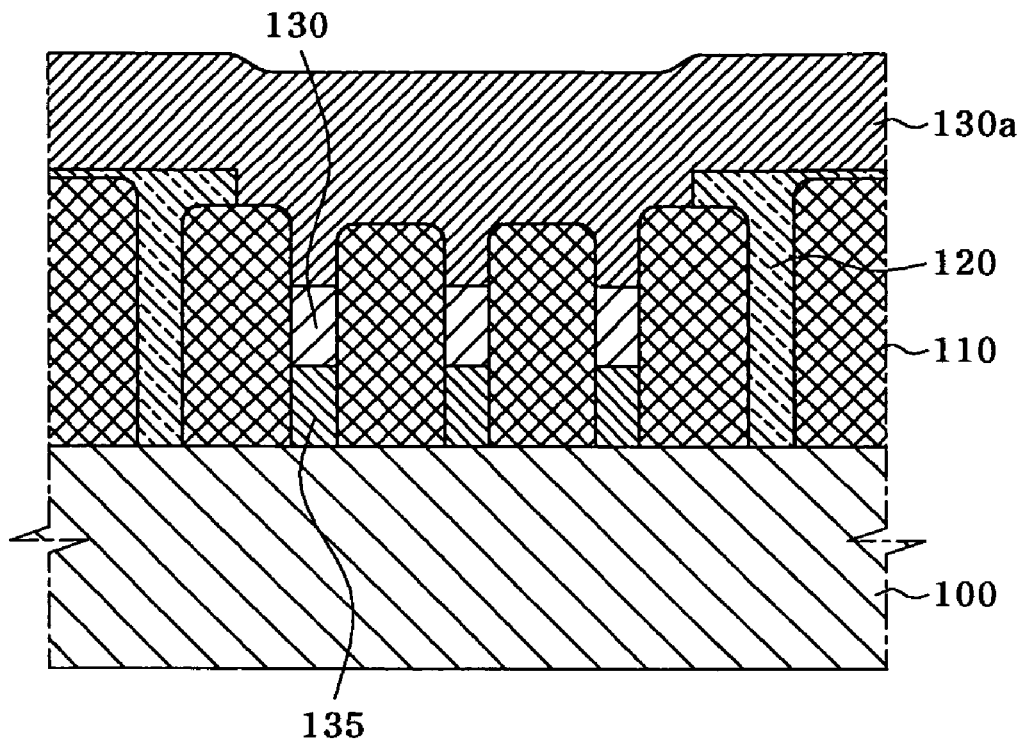
Figure 4E:
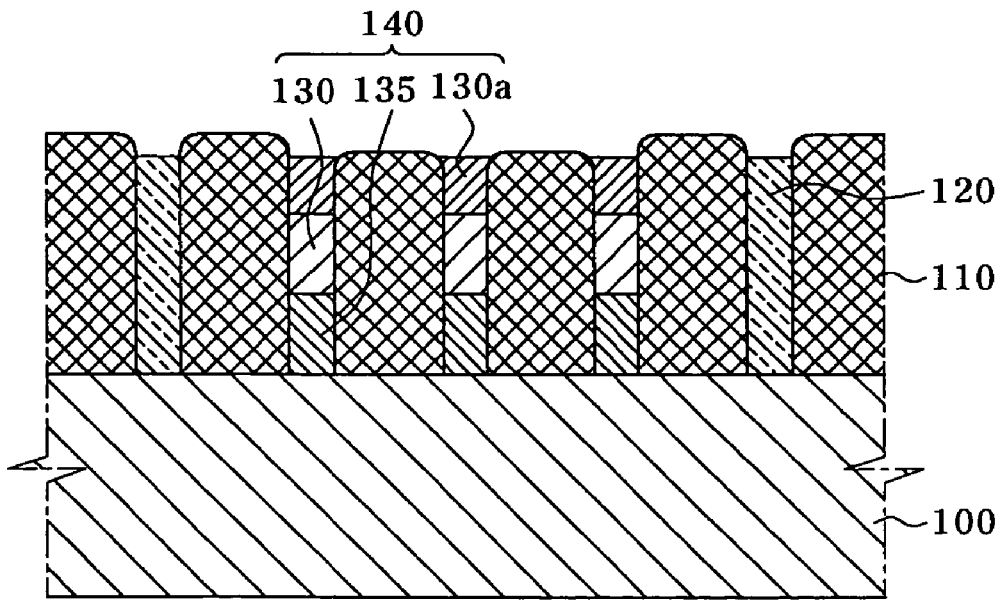

FIGS. 4a and 4e are sequential process cross-sectional views illustrating a method of manufacturing a semiconductor device in accordance with the embodiment of the present invention.

First, as shown in FIG. 4a, a plurality of gates 110 is formed on a semiconductor substrate 100, and an interlayer dielectric film 120 is formed thereon such that a plurality of gates 110 is embedded.

Then, as shown in FIG. 4b, the interlayer dielectric film 120 is selectively etched to open landing plug-forming regions, and solid phase epitaxy silicon 130 is deposited such that the thus-opened landing plug-forming regions in the interlayer dielectric film 120 is embedded. Herein, the SPE silicon 130 is composed of the same single crystals as the substrate 100, and serves to improve interface resistance in cell regions.

Next, as shown in FIG. 4c, boron ions are implanted into the SPE silicon 130. Herein, boron ions are preferably implanted at an implantation concentration of $10^{11}$ to $10^{15}$ ions/cm$^2$. As such, when boron ions are implanted into the SPE silicon 130, the SPE silicon 130 is mechanically and chemically hardened, which in turn functions to decrease a degree of dishing of SPE silicon 130 during subsequent planarization for formation of a landing plug.

Next, as shown in FIG. 4d, the resulting boron ion-implanted structure is annealed. As a result, boron ions are diffused downward from the upper part of SPE silicon 130, and single crystal silicon 135 are grown upward from the lower part thereof adjoining the substrate. Herein, annealing is carried out at a temperature of 500 to 800° C. It is possible to control the degree of diffusion of boron ions and the degree of growth of single crystal silicon by controlling the annealing conditions or characteristics, and there is no problem in forming a device even when boron ion-diffused SPE silicon contact the grown single crystal silicon 135.

As described above, in the present invention, it is possible to decrease dishing of SPE silicon during subsequent planarization by mechanically and chemically hardening the SPE silicon via boron ion implantation into the SPE silicon. In addition, it is also possible to minimize loss of the landing plug due to a cleaning solution in a cleaning process which will be performed after planarization.

Next, as shown in FIG. 4e, the boron ion-implanted SPE silicon 130a is planarized to the point at which the upper parts of the gates are exposed. Herein, planarization is effected via chemical mechanical polishing. Consequently, landing plugs 140 composed of single crystal silicon 135, SPE silicon 130 and boron ion-implanted SPE silicon 130a sequentially stacked are formed.

Next, as a subsequent process, a cleaning process is carried out to remove the residue of planarization produced during formation of the landing plug. Herein, sulfuric acid, BOE or SC1 may be employed as the cleaning solution.

Meanwhile, the semiconductor device in accordance with the present invention, formed according to the preceding processes as described above, as shown in FIG. 4e, comprises a plurality of gates formed on a semiconductor substrate 100, landing plugs 140 formed on predetermined regions between the gates 110, and an interlayer dielectric film 120 formed on the semiconductor substrate, such that the gates 110 are embedded. In such a semiconductor device, the landing plugs 140 are composed of single crystal silicon 135, SPE silicon 130 and boron ion-implanted SPE silicon 130a sequentially stacked on the semiconductor substrate 100 of the predetermined region having the landing plugs 140 formed thereon.

Such a semiconductor device in accordance with the embodiment of the present invention, as previously described, is formed with the least dishing of the SPE silicon in the planarization process for forming the landing plugs 140, via implantation of boron ions at a certain concentration, for example, at $10^{11}$ to $10^{15}$ ions/cm$^2$ into the SPE silicon of the landing plugs 140. Therefore, in a semiconductor device in accordance with the embodiment of the present invention, it is possible to sufficiently secure the CDs of the bit line contact formed on the landing plugs 140, thereby significantly reducing contact resistance.

As apparent from the above description, application of a semiconductor device and its manufacturing method in accordance with the present invention enables mechanical and chemical hardening of the SPE silicon via implantation of boron ions into the SPE silicon. Accordingly, the thus-hardened SPE silicon serves to decrease dishing of SPE silicon during planarization for formation of landing plugs. Therefore, CD of the landing plugs and bit line contact thereon is sufficiently secured by decreasing dishing of SPE and thus the semiconductor device having significantly reduced contact resistance can be provided.

Further, since the landing plugs are composed of the hardened SPE silicon, it is possible to minimize loss of the landing plugs due to a cleaning solution in a cleaning process which will be performed after planarization, and thus the device can be safely formed.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor device, comprising:

a plurality of gates formed on a semiconductor substrate;

landing plugs formed on predetermined regions between the gates, and composed of single crystal silicon, SPE silicon and boron ion-implanted SPE silicon sequentially stacked on the semiconductor substrate wherein the SPE is hardened by the implanted boron ions; and an interlayer dielectric film formed on the semiconductor substrate, such that the gates are embedded.

2. The semiconductor device according to claim 1, wherein boron ions are implanted at an implantation concentration of $10^{11}$ to $10^{15}$ ions/cm$^2$.

3. A method of manufacturing a semiconductor device, comprising:

forming a plurality of gates on a semiconductor substrate;

forming an interlayer dielectric film thereon, such that the gates are embedded;

selectively etching the interlayer dielectric film to open landing plug-forming regions;

depositing SPE silicon thereon, such that the opened landing plug-forming regions in the interlayer dielectric film is embedded;

implanting boron ions into the SPE silicon to harden the SPE;

annealing the resulting boron ion-implanted structure; and, chemical mechanical polishing the hardened SPE to form landing plugs.

4. The method according to claim 3, wherein boron ions are implanted at an implantation concentration of $10^{11}$ to $10^{15}$ ions/cm$^2$.

5. The method according to claim 3, wherein annealing is carried out at a temperature of 500 to 800° C.

* * * * *